(12) United States Patent
Chaudhari

(10) Patent No.: US 7,615,776 B2
(45) Date of Patent: Nov. 10, 2009

(54) METHOD OF SELF-ASSEMBLING ELECTRONIC CIRCUITRY AND CIRCUITS FORMED THEREBY

(75) Inventor: Praveen Chaudhari, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 10/538,935

(22) PCT Filed: Dec. 18, 2002

(86) PCT No.: PCT/US02/40307

§ 371 (c)(1),
(2), (4) Date: Jun. 13, 2005

(87) PCT Pub. No.: WO2004/059730

PCT Pub. Date: Jul. 15, 2004

(65) Prior Publication Data

US 2006/0049486 A1 Mar. 9, 2006

(51) Int. Cl.
H01L 51/00 (2006.01)
H01L 23/48 (2006.01)

(52) U.S. Cl. .................. 257/40; 257/616; 257/746; 257/E51.04

(58) Field of Classification Search .......... 257/616, 257/40, 746, E51.04, E51.039, E23.074, 257/E23.165
See application file for complete search history.

(56) References Cited

U.S. PATENT DOCUMENTS

| | | | |
|---|---|---|---|
| 6,262,129 B1 * | 7/2001 | Murray et al. | 516/33 |
| 6,265,021 B1 * | 7/2001 | Black et al. | 427/131 |
| 6,340,822 B1 * | 1/2002 | Brown et al. | 257/25 |
| 6,407,443 B2 * | 6/2002 | Chen et al. | 257/616 |
| 2001/0023986 A1 * | 9/2001 | Mancevski | 257/741 |
| 2002/0079487 A1 * | 6/2002 | Ramanath et al. | 257/40 |
| 2002/0167374 A1 * | 11/2002 | Hunt et al. | 333/186 |

OTHER PUBLICATIONS

European Search Report dated Nov. 19, 2007.
Collier, C.P., et al., "Electronically Configurable Molecular-Based Logic Gates", Science, American Association for the Advancement of Science, US, vol. 285, No. 5426, Jul. 16, 1999, pp. 391-394.
Hermanson, et al., "Dielectrophoretic Assembly of Electrically Functional Microwires from Nanoparticle Suspensions", Nov. 2, 2001, vol. 294, pp. 1082-1086.
Dimitrakopoulos, et al., "Organic Thin Film Transistors for Large Area Electronics", Advanced Materials, 2002, vol. 14, No. 2, pp. 99-117.

* cited by examiner

*Primary Examiner*—Lex Malsawma
(74) *Attorney, Agent, or Firm*—Vazken Alexaniar; McGinn IP Law Group, PLLC (57) ABSTRACT

A method of assembling a circuit includes providing a template, enabling a semiconductor material to self assemble on the template, and enabling self-assembly of a connection between the semiconductor material and the template to form the circuit and a circuit created by self-assembly.

15 Claims, 6 Drawing Sheets

METHOD OF SELF-ASSEMBLING ELECTRONIC CIRCUITRY AND CIRCUITS FORMED THEREBY

BACKGROUND OF THE INVENTION

1. Field of the Invention

The present invention generally relates to a method of assembling electronic circuits and an electronic circuit formed using that method. More particularly, this invention relates to a method of enabling self-assembly of electronic circuitry and to self-assembled electronic circuits.

2. Description of the Related Art

Formation of electronic circuits using lithographic techniques is well known. However, the formation of these circuits requires multiple layer formation steps. For example, one may have as many as 25 masking steps to form an electronic circuit using lithographic techniques. These processes are very expensive to perform and each layer adds cost to the manufacturing process of lithographically forming electronic circuits.

It is also desirable to reduce the size of the electronic elements forming the circuit. The smaller the size of the device, the more difficult it is to manufacture and, thus, the more expensive the device becomes to manufacture. This trend is further complicated by the fact that, as the devices approach molecular scales, multistep lithographic approaches may not work at all due to lithographic constraints imposed by resolution and alignment. Hence, it is desirable to be able to form these very small device elements, such as at the molecular scale, with a minimum of lithographic processing.

Applicants incorporate by reference herein in their entirety U.S. Pat. Nos. 6,262,129 and 6,265,021.

SUMMARY OF THE INVENTION

In view of the foregoing and other problems, drawbacks, and disadvantages of the conventional methods and structures, an object of the present invention is to provide a method and structure in which an electronic circuit is assembled using a driving force which causes atoms to assemble in a desirable fashion.

An object of the invention is to minimize the number of lithographic steps. We demonstrate how this can be done in one lithographic step, thus saving money.

In a first aspect of the invention, a method of assembling a circuit includes providing a template, enabling a semiconductor material to self assemble on the template; and enabling self-assembly of a connection between the semiconductor material and the template to form the circuit.

In a second aspect of the invention, a method of assembling a circuit includes: forming a first metal layer on a substrate; forming an insulating layer on the first metal layer, forming a second metal layer on the insulating layer; self-assembling a first conductivity type material on one side of the first metal layer, and self-assembling a second conductivity type material on the other side of the first metal layer to form an assembly.

In a third aspect of the invention, a circuit includes: a template; a semiconductor material self assembled on the template; and a self assembled connection between the semiconductor material and the template to form a circuit.

An exemplary embodiment of the present invention forms an electronic device using at least one self-assembly step. An exemplary method of the invention forms molecular-sized transistors and connecting wires using a self-assembly process by applying a driving force which causes atoms to form transistors and nanowires which complete an electronic circuit. Using an exemplary method of the invention, there is no need to complete an electronic device using a lithographic process.

Another exemplary embodiment of the present invention forms an electronic device having molecular dimensions. The electronic device includes organic molecules whose size can range from less than a nanometer to several nanometers and clusters of atoms that form nanoparticles ranging in size from less than a nanometer to tens of nanometers.

An exemplary method of the present invention provides a driving force which causes nanoparticles such as atoms, molecules, or small clusters of them to assemble themselves into nanowires which complete an electronic circuit, called "self assembly," whereby an electronic device is formed by applying a driving force which causes atoms form nanowires. The driving forces or fields for self assembly can be at the atomic scale, such as the local interaction of molecules with each other and the surface, or long range which cause atoms or their clusters to move to desired locations and arrangements. The driving forces or fields can be uniform or have spatial and temporal variation. An exemplary field is an electric field which can be a DC field or an AC field. Other examples of fields include electromagnetic fields, such as light, a chemical field, or a magnetic field. There can also be a combinations of fields.

An exemplary method in accordance with the invention produces electronic circuits that self-assemble. The present invention avoids costly photolithography involving many steps and takes advantage of molecular transistor elements, fabricates nanowires for metallization, and capacitors, if needed, which are connected between circuit elements.

In yet another exemplary embodiment, cross-overs of wires are formed using the inventive self-assembly method.

BRIEF DESCRIPTION OF THE DRAWINGS

The foregoing and other purposes, aspects and advantages will be better understood from the following detailed description of exemplary embodiments of the invention with reference to the drawings, in which.

DETAILED DESCRIPTION OF PREFERRED EMBODIMENTS OF THE INVENTION

The inventors illustrate a first exemplary method of the invention by teaching how to construct a two transistor inverter circuit. Although the following description provides specific examples, it is understood that the exemplary methods described here can be applied to many variations of circuitry used, for example, in computers or sensors for biomedical applications.

First Exemplary Embodiment

Referring to FIGS. 1A-1D, 2 and 4 in a first exemplary method in accordance with the invention, the method starts at step S400 and continues to step S402 where a substrate (not shown) such as oxidized silicon or an insulator is provided on a conducting plane which can be used as a ground plane.

Figures 2, 3, 4:
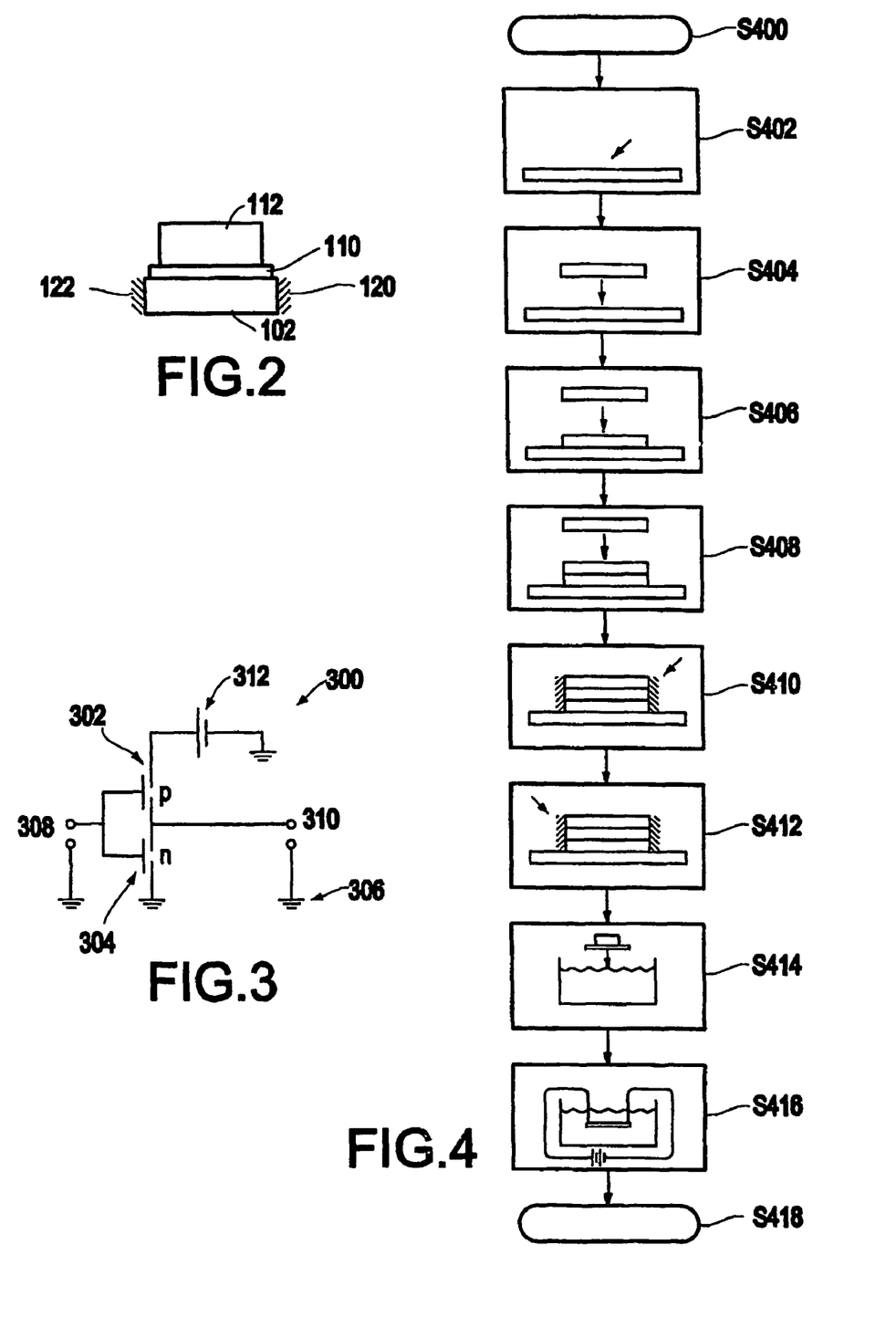
FIG. 2 shows a cross-section of the inverter along lines II-II of FIGS. 1a-1d.
FIG. 3 shows a circuit diagram of the inverter formed with the first exemplary method of FIGS. 1a-1d.
FIG. 4 illustrates a flowchart of the first exemplary method of FIGS. 1a-1d.

In step S404, on this substrate, a one step shadow mask, or a lithographically defined area, is used to deposit a conducting layer which can be metallic or organic. A patterned gold layer 102 (FIG. 1A) illustrates an example of this layer. The gold layer 102 may be formed on an adhesion layer such as Ti (not shown). The gold layer 102 includes contacts 104, three elongated stripes 106 and pointed structures 108, which are also known as "field concentrators," extending from the outer two stripes. The stripes are elongated here for illustrative purposes only. In an actual circuit, their shapes and dimensions will depend on the specific design of a system in which the inverter may be embedded.

In step S406, an insulating film 110 (FIG. 2), such as an aluminum oxide is formed on the stripes 106 of the gold layer 102. It is understood that, while this exemplary embodiment discloses the use of aluminum oxide for the insulating thin film 110, many other materials may also be used, including organic materials.

Figure 1A:
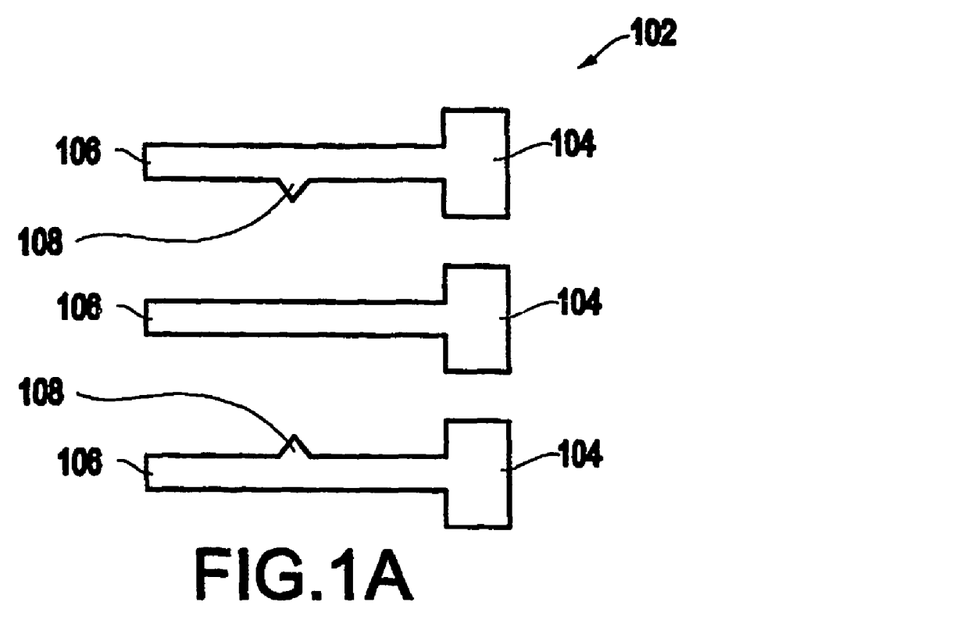
FIGS. 1a-1d illustrate a first exemplary method for forming an electronic inverter in accordance with the invention.
Figure 1B:
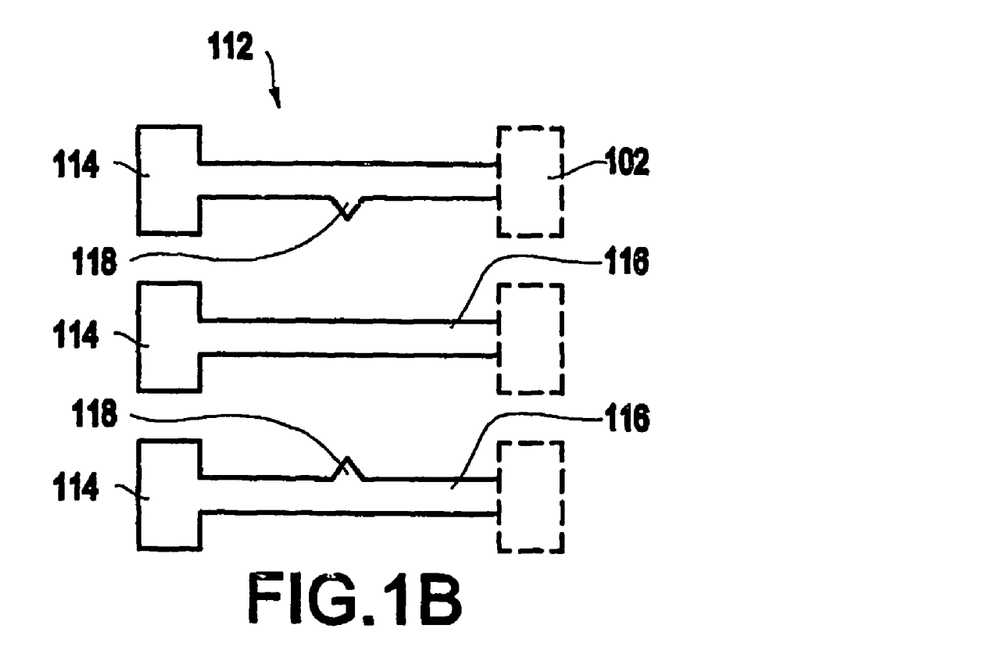

The process continues to step S408 where a metal layer 112 (e.g., an aluminum layer) is formed (FIG. 1B). The gold layer 102 is shown by broken lines in FIGS. 1*b*-1*c*. The aluminum layer 112 includes contacts 114, stripes 116 and field concentrators 118. The stripes 116 of the aluminum layer 112 overlay the stripes 106 of the gold layer 102 and the field concentrators 118 of the aluminum layer 112 overlay the field concentrators 108 of the gold layer 102.

The gold layer 102 and the aluminum layer 112 may be formed using masking as the contact areas 104 and 114 are large so as to be accessible by test probes for an isolated invertor. If, however, the contact array (described below) is used, the contact area may be made with a lithographic step.

In steps S410 and S412, organic molecules containing thiols at their ends are deposited by evaporation at an angle that exposes only one edge of the gold film 102. A large number of organic semiconductor materials are available (see, for example, the review paper by C. D. Dimitrakopoulos and P. R. L. Malenfant, Advanced Materials, V 14, p99, 2002). It is well known in the art how to attach sulfur to the end of most of these molecules. Here sulfur is chosen because a gold layer was chosen as the metallic layer. Had another conductor been chosen, then the corresponding end group of the semiconductor molecule might be modified such that the end group attaches itself preferentially to the exposed surface of this layer as sulfur does to gold, silver, or platinum.

In step S410, a first type of semiconductor material 120 (e.g., p-type material) is formed which has thiol (sulfur) at the ends. By choosing an appropriate temperature, such as room temperature for the present example, the oncoming molecules have a larger sticking coefficient with the gold than with other material. As a result, the p-type semiconductor material 120 deposits and self assembles in the proper orientation at the edges of the gold film 102 on one side. The self assembly of sulfur-containing organic semiconductor molecules such as thiols on gold is well known and published. The sulfur bonds to the gold surface due to chemical interaction. The proximity of the organic molecules to each other on the gold surface produces a semi-conducting organic film or layer, which can have an ordered arrangement, as in a crystals, or a disordered arrangement, as in glass.

In another exemplary embodiment of this invention, it is conceivable that when sulfur is present at both ends of an organic molecule, the molecule may lie flat on the gold surface rather than perpendicular to it. In this case, organic molecules with only one end having sulfur are used. After this end has attached to the gold surface and organic molecules have self assembled themselves, then the other end of the organic molecules are exposed to chemicals that attach sulfur to it.

Similarly, in step S412, a second type material (e.g., an n-type organic material) with sulfur termination is deposited from the other side so as to form a self-assembled n-type organic film 122.

Next, connect the aluminum layers 112 to the other ends of the surfaces of the sulfur-containing organic semiconductor material 120 and 122 (the side opposite to the ones attached to the gold film 102). This is done in steps S414 and steps S416 by bringing the assembly into contact with a solution which contains metallic nanoparticles (step S414), such as by applying a field(s) (e.g., an electric field, etc.) between the gold film 102 in the center and the two aluminum lines 112 on either side of the central electrode. Thus, an electric field is applied between two contact pads (e.g., 104 and 114) to create a self-assembled metallic nanowire connection formed from the nanoparticles. This type of wire formation, using gold nanoparticles, has been described in the scientific literature, for example see the article by Hermanson et al. (*Dielectrophoretic Assembly of Electrically Functional Microwires from Nanopartice Suspensions*, Science, v. 294, p1082, 2001).

The lines, 112, each have a field concentrator which provide a gradient in the spatial distribution of the electric field. This field attracts the nanoparticles in the solution to the field concentrators 118, which nanoparticles deposit on the field concentrators 118, to form nanowires 124. The nanowires 124 will terminate on the sulfur-containing organic semiconductor material 120 and 122, thereby forming the end of the other electrode closest to the field concentrator, because of the intensity of the field gradient. If the particles in the solution are made of gold, then the sulfur at the end of the organic semiconductor molecule will form a bond with the nanowires 124. This completes the fabrication at step S418 and the resulting exemplary structure is a two transistor inverter circuit 300, as shown schematically in FIG. 3.

In the exemplary method discussed above, the gold film 102 terminates on the semiconductor material with dimensions that are equal to or somewhat larger than the diameter of the nanoparticles including the wire. Once the nanoparticle wire makes contact between the two electrodes, the applied electric field is confined to the wire and, hence, there is no electric field to drive further growth of the wire. However, if a larger contact area is desired to enhance the magnitude of the current that can be switched on and off, this can be accomplished by using gold nanoparticles that have a negative charge on them in solution.

A positive voltage applied to the gold film 102 will attract gold particles to the ends of the semiconductor molecules, and bond to the sulfur atoms. After the line of nanoparticles has formed, the gold particles are replaced by a solution containing neutral gold particles. and an AC field is now used, as described above, to form a wire between the aluminum line and the gold nanoparticles attached to the semiconductor material.

While this exemplary embodiment discusses a positive voltage being applied to the gold layer, it is understood that the invention is intended to include any electric charge.

The inverter 300 in FIG. 3, includes a p-type transistor 302 and an n-type transistor 304 with six contacts. Three of the contacts are connected to ground 306 while one is an input 308, another is an output 310 and the remaining contact is connected to a voltage source 312. The result is a traditional inverter 300.

If an inverter with a single transistor and resistor is required, this too can be built following the methods of the present invention. For example, the resistor, like the gold nanowires described above, can be made of nanoparticles assembled in a field gradient. It is also possible to make capacitors using this technique by coating the metal particles with an appropriate dielectric material.

Second Exemplary Embodiment

FIGS. 5A-5E illustrate a second exemplary method for forming a structure (e.g., a NAND gate 500 (completed structure shown schematically in FIG. 6)) in accordance with the invention.

Figure 5A:
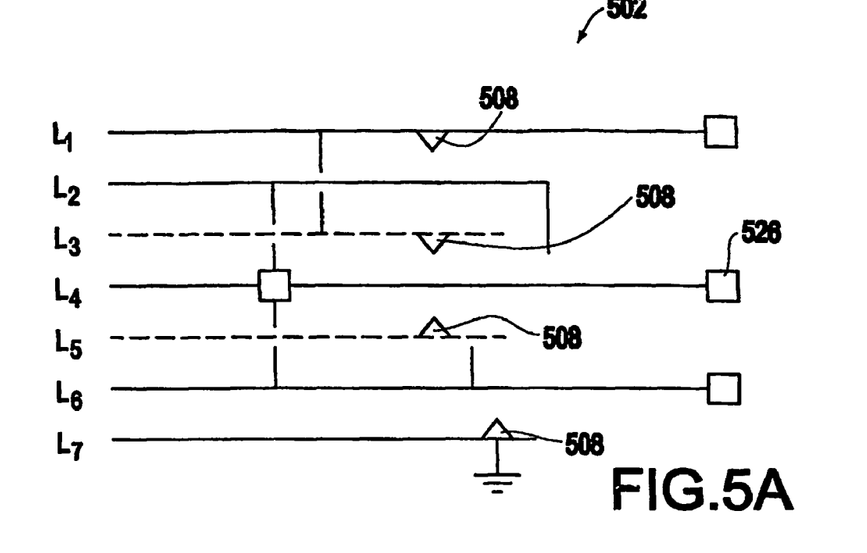
FIGS. 5A-5E illustrate a second exemplary method for forming an electronic logic NAND gate in accordance with the invention.

In FIG. 5A, a first metal (e.g., gold) layer 502 is formed on a substrate 501 (see FIG. 5C) by, for example, evaporation in a vacuum. The thickness of these films is in the tens of nm range. In these Figures., the metal (e.g., gold) lines L1-L7 are shown both as solid and broken lines. The solid lines are similar to those used in the inverter circuit and the broken lines will be used to provide for connections and crossovers, as described below. FIG. 5A also shows that lines L1, L3 and L5 include field concentrators 508 which will be used below.

Figure 5B:
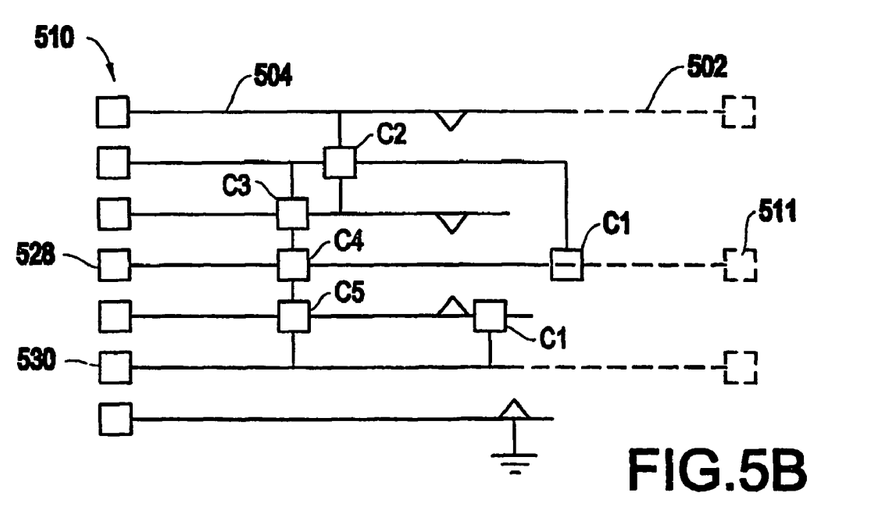
Figure 5C:
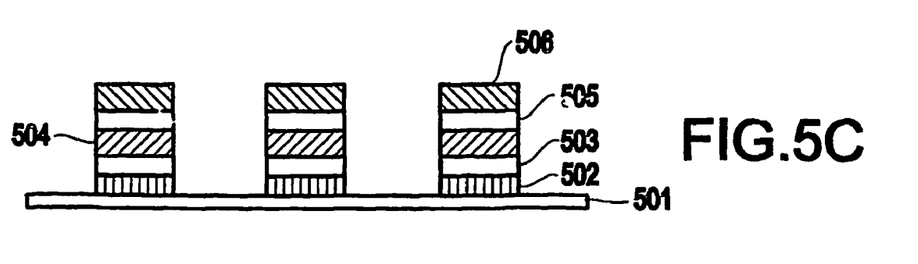
Figure 5D:
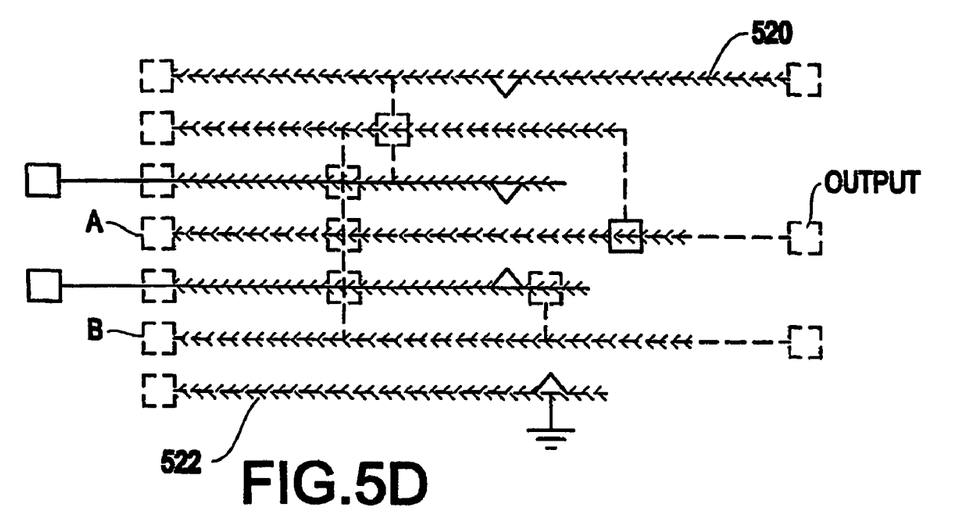
Figure 5E:
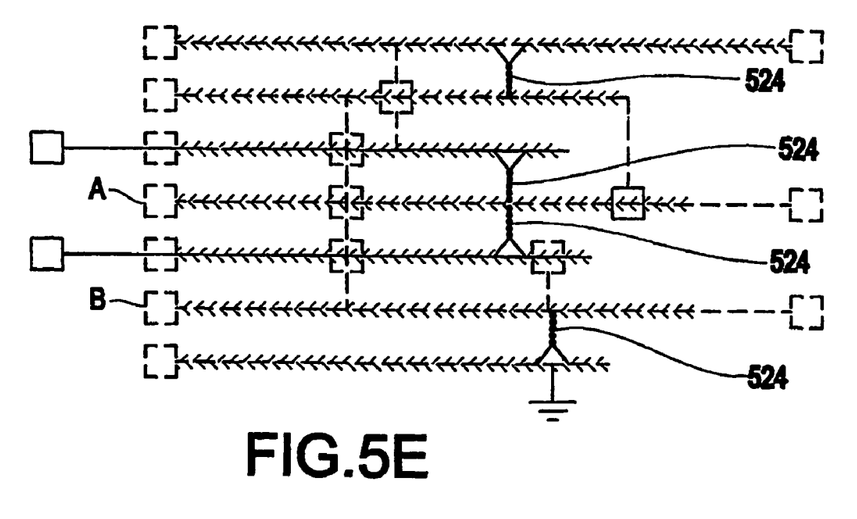
Figure 6:
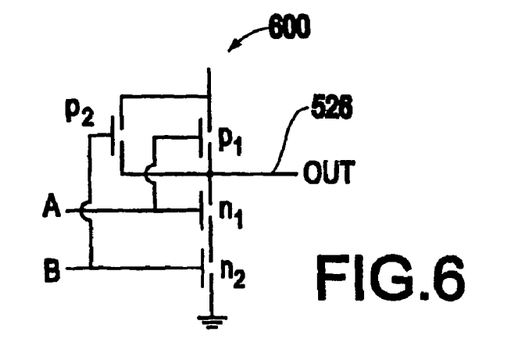
FIG. 6 shows a circuit diagram for the NAND gate formed with the second exemplary method of FIGS. 5A-5E.

As shown in FIGS. 5 and 6, one of the contacts pads 526 on line IA of the first metal layer 502 will eventually form the output.

On top of this first metal (e.g., gold) layer 502, an insulating layer 503 (only shown in FIG. 5C) is deposited followed by a second metal (e.g., aluminum) layer 504 as shown in FIG. 5B. The second metal layer 504 includes contact pads 510. Two of these contact pads 528 and 530 on lines L4 and L6 will form contact inputs A and B as shown in FIG. 6, respectively. Square boxes in these figures also show where the connection lines C1 and crossover lines C2, C3, C4, and CS will be formed.

Then, as shown in the cross-sectional view of FIG. 5C, a second insulating layer 505 followed by a third metal (e.g., aluminum) layer 506 is formed. There are now three metallic layers including a first metal (e.g., gold) layer 502, a second metal (e.g., aluminum) layer 504 and a third metal (e.g., aluminum) layer 506 separated by insulating layers 503 and 505. The third metal layer 506 is at least formed on lines L3 and L5 as shown in FIG. 5D.

All of these different materials can be deposited by well known vapor deposition techniques. The thickness of the insulating and conducting layers are all in the tens of nanometers range. The precise thickness used may be determined by the diameter of the metal (e.g., gold) nanoparticles and by the amount of current desired from the device. For example, if a larger current is desired then a thicker metal (e.g., gold) layer and larger diameter metal (e.g., gold) nanoparticles are used. For the connections C1, the first metal (e.g., gold) layer 502 in line L2 is connected to the first metal (e.g., gold) layer 502 in line L4 and the metal (e.g., gold) layer in line L6 is connected to the second metal layer 504 by applying a field(s) (e.g., an AC electric field) between the two appropriate lines in the presence of metal (e.g., gold) nanoparticles. The precise field type used is determined by the spacing between the lines. The spacing, in turn, may be determined by the desired device dimension. In crossover C2, the first metal (e.g., gold) layer 502 in line L1 is connected to the third metal (e.g., aluminum) layer 506 and then to the first metal (e.g., gold) layer 502 in line L3, thus providing a crossover of line L2. In crossover C3, second metal (e.g., aluminum) layer 504 in line L2 is connected to the third metal (e.g., aluminum) layer 506 in line L3, which in turn is connected to line L4. In crossover C4, third metal (e.g., aluminum) layer 506 from line L3 is connected to third metal (e.g., aluminum) layer 506 of line L5 via third metal (e.g., aluminum) layer 506 of line L4. The last crossover C5, connects third metal (e.g., aluminum) layer 506 of line L5 to second metal (e.g., aluminum) layer 504 of line L6 via third metal (e.g., aluminum) layer 506 of line L5.

Similarly to the method described in accordance with the first exemplary method, organic first and second type (e.g., p- and n-type) semiconductor molecules containing sulfur atoms at their ends are deposited by evaporation at an angle that exposes only one edge of the first metal (e.g., gold) film 502 in the active area of the device.

As illustrated in FIG. 5D, a first type (e.g., p-type) semiconductor material 520 is formed which has thiol (sulfur containing) molecules at the ends. As explained above, the first type (e.g. p-type) semiconductor material 520 deposits and self assembles in the proper orientation at the edges of the first metal (e.g., gold) film 502 on one side. Similarly, a second type (e.g., n-type) organic material with sulfur termination is deposited from the other side so as to form a self assembled second type (e.g., n-type) organic film 522 on the first metal (e.g., gold) film 502.

Next, the second metal (e.g., aluminum) layer 504 is connected to the other ends of the organic surfaces 520 and 522 (the side opposite to the ones attached to the first metal (e.g., gold) film 502). As explained above, this is done by bringing the assembly into contact with a solution which contains metallic nanoparticles and by applying an electric field between the first metal (e.g., gold) film 502 and the second metal (e.g., aluminum) layer 504. The electric field attracts metal (e.g., gold) nanoparticles to the field concentrators 508 (shown in FIG. 5a), whereby the nanoparticles deposit on the field concentrators 508 to form nanowires 524 (FIG. 5E) that will terminate on the sulfur containing organic semiconductor material 520 and 522. If the particles in the solution are made of gold, then the sulfur will form a bond with the nanowires 524. This completes the fabrication and the resulting exemplary structure is a NAND gate 600, as shown schematically in FIG. 6.

It can be seen that the pads 510 on the left hand side of line L4 and line L6 provide for the A and B inputs shown in FIG. 6, whereas the pad 526 on the right side of line L4 is the output relative to the ground to form a NAND gate. The preceding description of the steps required to form a NAND gate result in a circuit that has four transistors: two p-type and two n-type with metallic connections and crossovers. The resulting circuit is shown schematically in FIG. 6 and when an appropriate battery and ground connections (not shown in the figures) are made functions as a NAND gate.

Figure 1C:
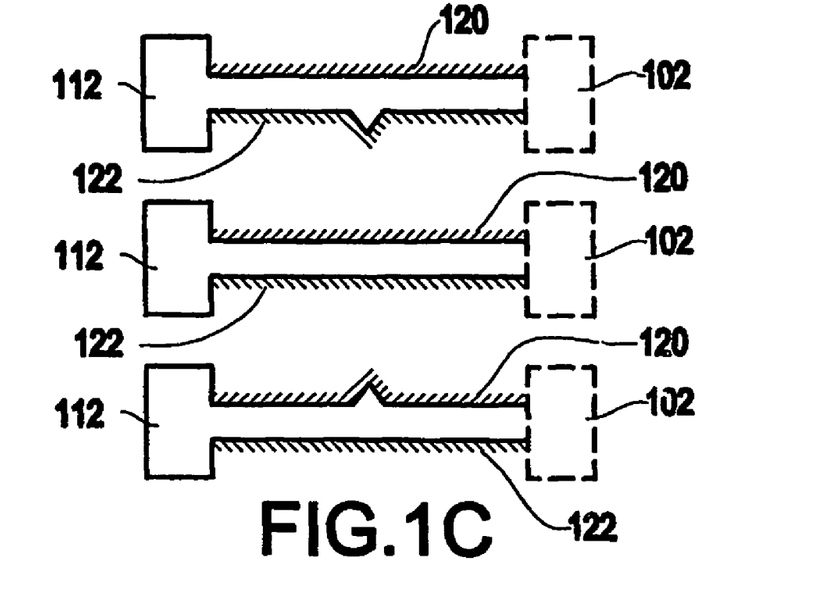
Figure 1D:
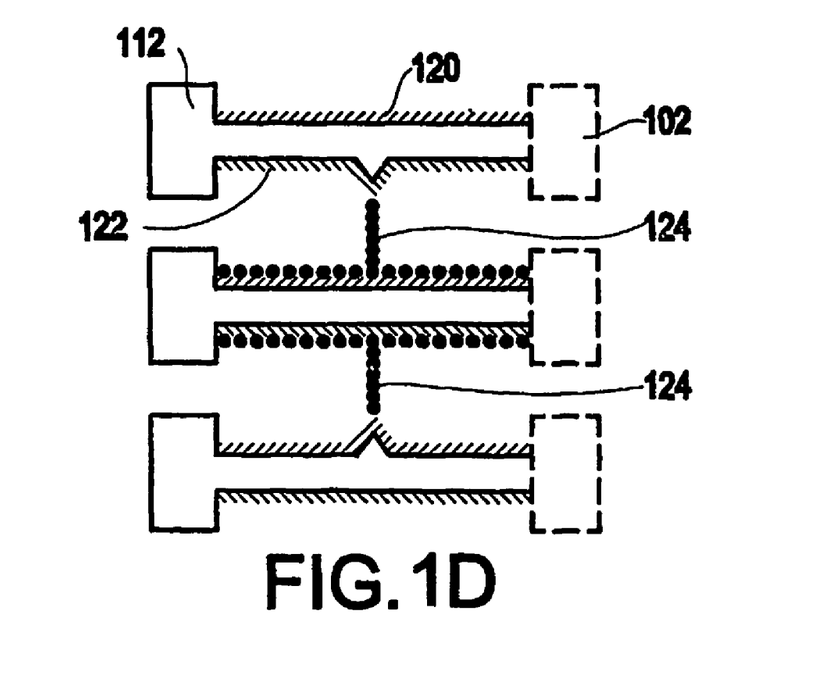
Figure 7:
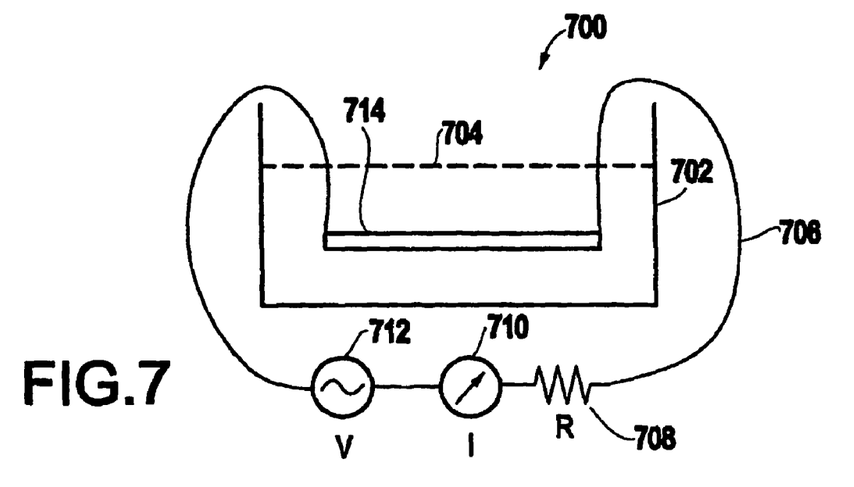
FIG. 7 shows a first exemplary method of applying a driving force which is an electric field in accordance with an exemplary embodiment of the invention.

FIG. 7 shows one exemplary apparatus 700 for applying a driving force which is an electric field to enable self-assembling of an electric circuit in accordance with one exemplary embodiment of the invention. The apparatus 700 includes a container 702 containing a solution 704 which includes metal (e.g., gold) nanoparticles (not shown). A patterned circuit 714, such as is shown in FIG. 1c, is positioned in the solution 704. Contacts 104 and 114 are connected to a wire 706. The wire 706 is connected to a resistor 708, a current meter 710 and an AC power supply 712 to form a circuit which applies a driving force for enabling the self-assembly of an electronic device on the patterned circuit 714. The AC power supply 712 supplies AC power to the circuit until the formation of the electronic device on the patterned circuit 714 is detected by the current meter 710. The resistor 708 serves to limit the amount of current being supplied to the nanowire being formed to avoid damage to the nanowire.

Figure 8:
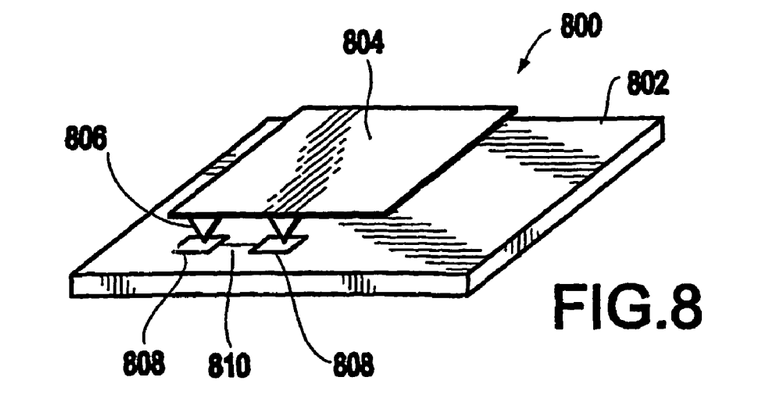
FIG. 8 shows a second exemplary method of applying a driving force which is an electric field in accordance with an exemplary embodiment of the invention

FIG. 8 shows another exemplary apparatus 800 for applying a driving force which is an electric field to enable self-assembling of an electric circuit in accordance with one exemplary embodiment of the invention. The apparatus includes a patterned board 804 which includes probes 806 which are positioned into contact with pads 808 on the patterned circuit 802 upon which the electronic device is to be self-assembled. As described above, the patterned circuit 802 is placed into a solution containing nanoparticles which will form a nanowire between the pads 808. The probes 806 supply the electric fields to the contacts 808 to allow self-assembly of a nanowire 810. The patterned board 804 may be provided with multiple probes 806 (not shown) in a two-dimensional array to apply an electric field to corresponding multiple contacts 808 (not shown) on the patterned circuit 802. In this manner, multiple nanowires may be self-assembled simultaneously or sequentially. Such patterned boards with nanoscale probes have been demonstrated recently in connection with storage devices (The "Millipede-"More than one thousand tips for future AFM data storage, by Vettiger et al IBM J. Res. Dev. V44, 323, 2000). These boards can be modified by one skilled in the art to provide electrical fields between any two points either sequentially or in parallel in a large scale complex circuit built using an exemplary method in accordance with the present invention as described herein for discrete devices.

Third Exemplary Embodiment

In yet a third exemplary method (not shown) of practicing the present invention, an electric field may be applied locally and without direct contact. In this exemplary method, a beam of electrons is focussed and applied to a line in a template containing a field concentrator. The beam of electrons may be generated by an electron beam machine and be focussed down to a nanometer in width. The beam of electrons will apply a charge to the line in the template and, therefore, will create a field around the line. If another line in the template is grounded, then a field gradient is established between the charged line and the grounded line. The field gradient is concentrated at the concentrator and the closest point on the grounded line. This field causes the nanoparticles to move and self assemble into a wire that will connect the two lines between the concentrator and the closest point on the grounded line.

The invention can also be easily tailored to produce other structures (e.g., a NOR gate, etc.). If a NOR gate is desired, the same procedure is followed except that the p and n type organic materials are deposited on opposite sides to those for a NAND gate.

The examples of self assembled electronic logic gates that are described above have used a template on which the structure was built using self assembling techniques. The design of this template, including its size and shape, then becomes important in any self assembly circuitry. The actual self assembly is done in vacuum systems and/or solution baths which are very large compared to the circuitry and yet because of the choice of the template and its materials, the atoms, molecules, and clusters of atoms give rise to a functioning circuit when appropriate fields are applied. The lithographic expertise, if needed, is required only in making the template As mentioned above, an object of the invention is to minimize the number of lithographic steps. In the examples shown above, the invention has been demonstrated using a single lithographic step, thus saving a great deal of money.

While the above description emphasizes small devices. It is understood that the method of self assembly in accordance with the present invention can also be used for much larger devices.

It is also understood that the method of connection described herein can be used to connect a small device to a large device. For example, the present invention may be used to connect a molecular scale device to a lithographically produced device having larger features. An example of which would be connecting a molecular scale memory device to a lthographically produced sensing device that sends instructions to read and write into the memory.

While the invention has been described in terms of several exemplary embodiments, those skilled in the art will recognize that the invention can be practiced with modifications.

Further, it is noted that, Applicant's intent is to encompass equivalents of all claim elements, even if amended later during prosecution. Further, it is noted that, Applicant's intent is to encompass equivalents of all claim elements, even if amended later during prosecution.

What is claimed is:

1. A circuit comprising:
   a first metal layer on a substrate;
   an insulating layer on said first metal layer;
   a second metal layer on said insulating layer;
   a self-assembled first semi-conductivity type material on one side of said first metal layer;
   a self-assembled second semi-conductivity type material on the other side of said first metal layer; and
   a self-assembled nanowire extending between a field concentrator on said first metal layer and one of said first semi-conductivity type material and said second semi-conductivity type material to form said self-assembled connection.

2. The circuit of claim 1, wherein said first semi-conductivity type material comprises a p-type material.

3. The circuit of claim 1, wherein said second semi-conductivity type material comprises an n-type material.

4. The circuit of claim 1, wherein said self-assembled first semi-conductivity type material comprises organic molecules on one edge of said gold layer.

5. The circuit of claim 1, wherein said self-assembled second semi-conductivity type material comprises organic molecules on one edge of said gold layer.

6. A circuit comprising:
   a first metal layer formed on a substrate;
   an insulating layer formed on said first metal layer; a second metal layer formed on said insulating layer;
   a first self-assembled organic semiconductor material formed on a first side of said first metal layer;
   a second self-assembled organic semiconductor material on a second side of said first metal layer; and
   a self-assembled nanowire formed between said second metal layer and at least one of said first and second self-assembled organic semiconductor materials,
   wherein said second metal layer comprises a field concentrator, said self-assembled nanowire being formed on said field concentrator.

7. The circuit of claim 6, wherein said first and second self-assembled organic semiconductor materials comprise different conductivity types.

8. The circuit of claim 6, wherein said first metal layer comprises one of gold, silver and platinum.

9. The circuit of claim 6, wherein said second metal layer comprises an aluminum layer.

10. The circuit of claim 6, wherein an end of said first and second self-assembled organic semiconductor materials comprises a first termination which bonds to a surface of said first metal layer.

11. The circuit of claim 6, wherein said first termination comprises a sulfur atom.

12. The circuit of claim 6, wherein another end of said first and second self-assembled organic semiconductor materials comprises a second termination, said self-assembled nanowire being bonded to said second termination.

13. The circuit of claim 6, wherein said second termination comprises a sulfur atom.

14. The circuit of claim 6, wherein said nanowire comprises a gold nanowire.

15. A self-assembled structure for electrically connecting layers in a circuit including a first metal layer formed on a substrate, an insulating layer formed on the first metal layer, and a second metal layer formed on the insulating layer, said structure comprising:
- a first self-assembled organic semiconductor material formed on a first side of said first metal layer;
- a second self-assembled organic semiconductor material on a second side of said first metal layer; and
- a self-assembled nanowire formed between said second metal layer and at least one of said first and second self-assembled organic semiconductor materials,
- wherein said second metal layer comprises a field concentrator, said self-assembled nanowire being formed on said field concentrator.

* * * * *

UNITED STATES PATENT AND TRADEMARK OFFICE
CERTIFICATE OF CORRECTION

PATENT NO. : 7,615,776 B2  Page 1 of 1
APPLICATION NO. : 10/538935
DATED : November 10, 2009
INVENTOR(S) : Praveen Chaudhari It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1055 days.

Signed and Sealed this

Nineteenth Day of October, 2010

David J. Kappos
*Director of the United States Patent and Trademark Office*